US009232663B2

(12) United States Patent
Dingemans et al.

(10) Patent No.: US 9,232,663 B2
(45) Date of Patent: Jan. 5, 2016

(54) METHOD AND DEVICE OF A LED MATRIX

(75) Inventors: Antonius Petrus Marinus Dingemans, Tilburg (NL); Johannes Wilhelmus Weekamp, Beek en Donk (NL); Sébastien Paul René Libon, Tervuren (BE); Gerard Kums, Molenstede (BE); Giovanni Cennini, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/241,187

(22) PCT Filed: Aug. 29, 2012

(86) PCT No.: PCT/IB2012/054436
§ 371 (c)(1),
(2), (4) Date: Feb. 26, 2014

(87) PCT Pub. No.: WO2013/035017
PCT Pub. Date: Mar. 14, 2013

(65) Prior Publication Data
US 2014/0209942 A1 Jul. 31, 2014

Related U.S. Application Data

(60) Provisional application No. 61/596,754, filed on Feb. 9, 2012.

(30) Foreign Application Priority Data

Sep. 6, 2011 (EP) .................................... 11180233

(51) Int. Cl.
*H01L 21/00* (2006.01)
*H05K 3/30* (2006.01)
(Continued)

(52) U.S. Cl.
CPC *H05K 3/303* (2013.01); *F21K 9/90* (2013.01); *F21S 4/002* (2013.01); *F21V 21/002* (2013.01); *H01L 25/0753* (2013.01); *H01L 27/153* (2013.01); *H01L 33/62* (2013.01); *H05K 1/0283* (2013.01); *H05K 3/202* (2013.01); *H05K 13/046* (2013.01); *H01L 2924/0002* (2013.01); *H05K 1/0209* (2013.01); *H05K 1/0284* (2013.01);
(Continued)

(58) Field of Classification Search
CPC ...................................................... H01L 33/62
USPC .............................................. 257/88; 438/34
See application file for complete search history.

(56) References Cited

U.S. PATENT DOCUMENTS 4,746,618 A 5/1988 Nath et al.
5,385,848 A 1/1995 Grimmer
(Continued)

FOREIGN PATENT DOCUMENTS

WO 2009139787 A1 11/2009

*Primary Examiner* — Jamie C Niesz
(74) *Attorney, Agent, or Firm* — Meenakshy Chakravorty

(57) ABSTRACT

There is provided a method for manufacturing a light emitting diode, LED, matrix (100) comprising the steps of providing with a maintained integrity a conductor sheet (150) with a plurality of component areas (111) interconnected with meandering connection tracks (116), mounting a plurality of LEDs (120) to a respective component area thereby forming a subassembly (100'), trimming and stretching the subassembly thereby straightening the connection tracks such that an m×n LED conductor matrix is formed during the step of stretching.

11 Claims, 4 Drawing Sheets

(51) Int. Cl.
*H05K 3/20* (2006.01)
*H01L 25/075* (2006.01)
*F21K 99/00* (2010.01)
*F21S 4/00* (2006.01)
*H01L 27/15* (2006.01)
*H01L 33/62* (2010.01)
*F21V 21/002* (2006.01)
*H05K 13/04* (2006.01)
*H05K 1/02* (2006.01)
*H05K 3/00* (2006.01)

(52) U.S. Cl.
CPC ............ *H05K 3/0058* (2013.01); *H05K 3/0097* (2013.01); *H05K 2201/09263* (2013.01); *H05K 2201/09781* (2013.01); *H05K 2201/10106* (2013.01); *H05K 2203/04* (2013.01); *H05K 2203/1545* (2013.01); *H05K 2203/175* (2013.01); *Y10T 29/49144* (2015.01)

(56) References Cited

U.S. PATENT DOCUMENTS

| | | | |
|---|---|---|---|
| 7,301,174 B1* | 11/2007 | Popovich | F21K 9/00 257/88 |
| 7,942,551 B2 | 5/2011 | Weekamp et al. | |
| 2003/0090910 A1 | 5/2003 | Chen | |
| 2003/0137839 A1* | 7/2003 | Lin | F21S 4/006 362/237 |
| 2005/0036311 A1* | 2/2005 | Liu | F21S 4/001 362/249.01 |
| 2005/0212007 A1 | 9/2005 | Daniels et al. | |
| 2008/0277683 A1* | 11/2008 | Tasaki | H01L 27/14618 257/98 |
| 2008/0295327 A1 | 12/2008 | Aeling et al. | |
| 2009/0091932 A1* | 4/2009 | Weekamp | B21F 45/00 362/249.02 |
| 2009/0145551 A1 | 6/2009 | Luch | |

* cited by examiner

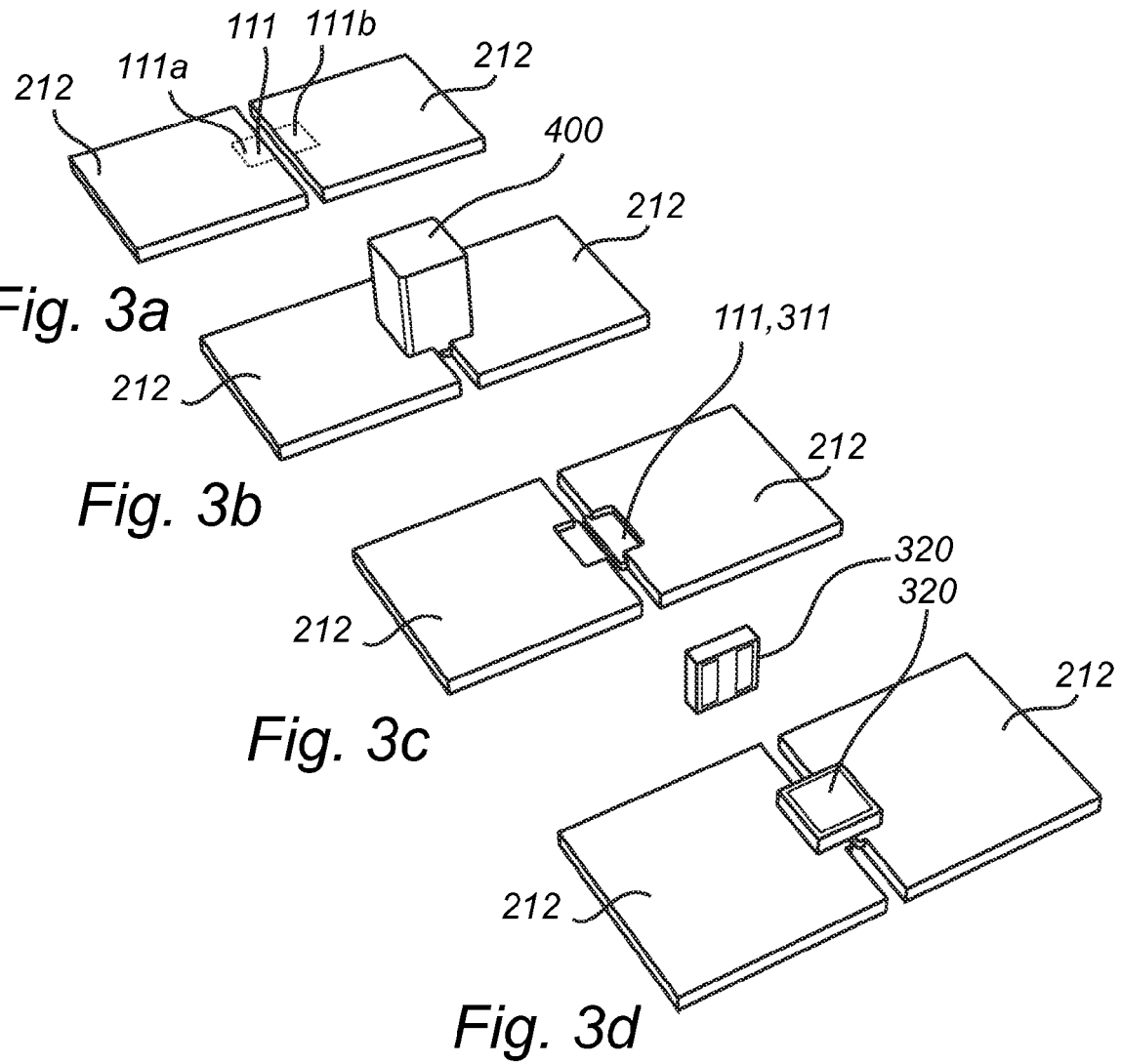

METHOD AND DEVICE OF A LED MATRIX

FIELD OF THE INVENTION

The present invention relates to the field of light emitting diode (LED) lighting devices, and more particularly to a method for manufacturing a light emitting diode, LED, matrix for large area LED lighting devices, and a corresponding lighting device.

BACKGROUND OF THE INVENTION

Light emitting diodes (LEDs) in large area lighting devices have been used for some time, where a large number of LEDs are arranged as an array or matrix to evenly provide lighting over a large area. Typically, LEDs have been arranged on a printed circuit board (PCB) by means of traditional surface mounting techniques. However, recently there has been proposed other types of solutions to provide large area LED arrays.

WO 2007/125566 A1 discloses a method for manufacturing a LED array in which N electrically conducting wires are arranged in parallel creating an array of wires having a width D perpendicular to the length direction of the wires. Further, LED components are arranged to the array of wires such that each LED component is electrically connected to at least two adjacent wires, and subsequently the array of wires is stretched such that the width of the array is increased. To connect to the wires, the LED components are each arranged with a printed circuit board or lead frame with snap locks, or by means of soldering, gluing, insulation displacement connection (IDC) or similar. The proposed method provides a low cost solution for applications where large lighting area is important. However, mounting of small components is difficult on wires, and the proposed method requires that the wires have to be placed on a temporary carrier which is removed after mounting of the components.

SUMMARY OF THE INVENTION

In view of the above, an object of the invention is to provide an alternative and improved method of manufacturing a LED array, and to at least alleviate the problems discussed above.

This object is achieved by a method for manufacturing a LED matrix according to the present invention as defined in claim 1. Thus, in accordance with an aspect of the present invention, there is provided a method for manufacturing a light emitting diode, LED, matrix comprising providing a first conductor structure having a plurality of component areas interconnected with meandering connection tracks by providing a conductor sheet with a first predetermined pattern, mounting a plurality of LEDs to a respective component area of the first conductor structure thereby forming a subassembly, trimming the subassembly to provide a second conductor structure, and stretching the subassembly thereby straightening the connection tracks. The second conductor structure is arranged such that an m×n conductor matrix is formed during the step of stretching. Thereby, there is provided an effective method to manufacture a large area LED matrix in which, in a first step, a conductor structure is provided from a conducting sheet material. The sheet material may advantageously be fed from a roll and the first conductor structure may be mechanically punched out while maintaining integrity of the conductor sheet. This allows for feeding the patterned conductor sheet into a standard soldering (or optionally gluing) pick and place process for mounting of the LEDs onto a respective component area. After trimming, e.g. by means of laser cutting, or punching and/or cutting, of the conductor sheet to release any integrity governing bridges, the conductor structure is stretched such that the meandering connection tracks are straightened and the large area matrix is formed. Thus, the method is suitable for a mechanical reel-to-reel process using standard component mounting facilities which is highly advantageous for producing large volumes at low cost. Further, by performing e.g. the mounting of the components in a high density set up, efficient time and space usage of the mounting facility is provided, while still providing a large area of the final LED matrix. A further advantage with the present concept, as compared to the prior art wire solution, is that LED's (or other components) having more than two connection pads are mountable on the subassembly, when the first predetermined pattern is adapted for such component.

In embodiments of the method, before stretching, additional coatings and/or optical elements are applied. Also bending the lead frame locally may be performed, which can be beneficial e.g. for changing the orientation of the LEDs.

According to an embodiment, the method further comprises arranging the stretched subassembly onto a substrate. By decoupling the production of the LED matrix from a traditional substrate (contrary to when using a PCB based LED matrix), the substrate onto which the LED matrix is mounted may be more freely chosen.

This substrate could act as reflector and in case of metal as additional heat sink According to an embodiment of the method, the first predetermined pattern is selected for providing at least one thermal pad area in the first or second conductor structure, which is advantageous for integrating predetermined areas with facilitated thermal dissipation into the LED conductor matrix.

According to an embodiment, at least one thermal pad area is arranged at a component area, or at a connection track. The area of the thermal pad is preferably selected to provide sufficient thermal dissipation to cool a LED or component at which it is arranged. According to an embodiment of the method (and the correspondingly produced LED conductor matrix and a lighting device in which the LED conductor matrix is arranged), the areas of thermal pads arranged at a LED or component are arranged to have different size on different sides of the component, which is advantageous e.g. when the component is asymmetrically dissipating heat, or in case one of the component/LED interconnect pads dissipate more heat than the other pad (due to material choice, position in the electrical design, position on the substrate etc.)

According to an embodiment, the method further comprises providing at least one recess in the component area for receiving LEDs or LED packages of a size less then 1×1×1 mm, which is advantageous. This is applicable for Wafer Level Chip Scale Package, WLCSP, which are expected to become the lowest cost package for LED's on the market.

According to an embodiment, the step of mounting comprises defining solder areas on the first conductor structure, applying solder onto the solder areas, placing the LEDs on a respective component area, and performing soldering, which is advantageous.

According to an embodiment, the first or second conductor structure is arranged with alignment features and/or stretch alignment features, like for instance holes.

According to an embodiment, the method further comprises providing mechanical deformation of the subassembly by means of one of splitting, trimming of the subassembly to a predetermined contour.

According to an embodiment, the method further comprises deforming at least one portion of the subassembly to provide a predetermined lighting direction of at least one LED. For instance, portions onto which specific LEDs are arranged may be bent to provide a predetermined lighting direction for the LEDs, thereby enabling the use of top emitting LEDs as side emitting LEDs.

According to an embodiment, the method further comprises providing deformation of the subassembly for providing one of: optical properties, mechanical fixation of the component interconnect board, mechanical fixation of additional components, thermal properties, and connector functionality.

According to an embodiment, at least one of providing the first predetermined pattern and the second conductor structure is done by means of etching, cutting, punching, slitting or laser cutting.

According to a second and third aspects of the invention, there is provided a LED matrix produced with a method according to the invention, and a large area lighting device comprising such a LED matrix. These have the same advantages as mentioned above with respect to the method, e.g. the decoupled processing of the circuitry before mounting to the substrate allows for providing lighting devices with more optimized substrates. Further, the LED matrix produced according to the present method can be made very large without requiring interconnect between sub portions of a matrix (compare for instance with large area lighting with the standard PCB solution, which either requires use of very large PCB's, which as previously mentioned still are limited in size and expensive to produce, or use of an array of PCB's with interconnect liners between the individual PCBs).

The described invention is broadly applicable in LED products but especially interesting for LED modules and lamps, which are really large measuring up to several $m^2$. Other objectives, features and advantages will appear from the following detailed disclosure, from the attached dependent claims as well as from the drawings.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, where the same reference numerals will be used for similar elements, wherein:

FIGS. 3a) to d) are schematic illustrations of manufacturing steps of a detail of an embodiment of a LED matrix according to the present invention.

DETAILED DESCRIPTION OF PREFERRED EMBODIMENTS

An exemplifying embodiment of the method for manufacturing a LED matrix according to the present invention is now described with reference to FIGS. 1a)-e). The steps of the method are described as a continuous sequence, however some of the steps may be performed in another order or some additional process step may be interleaved. The conductor structure in the LED matrix is also referred to as a lead frame herein under.

Figure 1A:
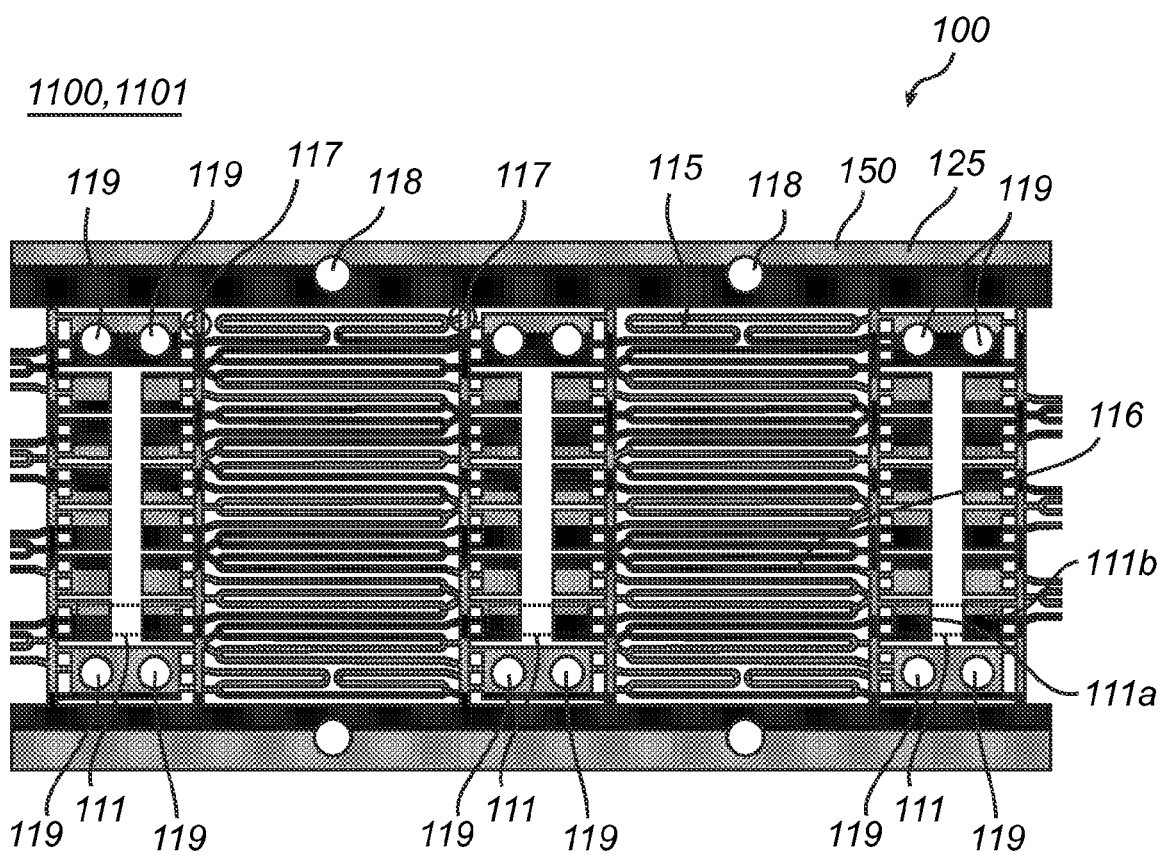
FIGS. 1a) to c) are schematic top views, and d) to e) are perspective views of a LED matrix according to the present invention during different steps of manufacturing.

With reference now to FIG. 1a), and starting at a step [1100] of the method, a conductor sheet 150 is initially provided. The conductor sheet is preferably selected amongst a group of metal sheet materials comprising Cu, Cu/Ni, Ni/Fe, Cu plated Fe, Cu plated RVS (stainless steel), tin plated Fe, and metal plated polymers. The conductor sheet 150 is here a 200 µm thick copper sheet.

A first predetermined pattern 115 is at a step [1101] applied to the conductor sheet 150, thereby forming a first conductor structure 100, which corresponds to a specific mechanical and electronic layout while still maintaining the necessary integrity. The step [1101] of providing the first predetermined pattern is here done by means of laser cutting. Optionally, the first predetermined pattern 115 in the conductor sheet 100 is provided by means of a punching, or a masking and etching process. The first predetermined pattern 115 is selected to provide a plurality of component areas 111 dedicated for electrical and mechanical connection of LEDs 120. Each component area 111, comprises a pair of connection pads 111a, 111b separated by a gap Δ. The component areas 115 are further interconnected via meandering connection tracks 116 which are designed to, when stretched, form an electrical circuitry for a LED matrix.

For a typical LED matrix, a series parallel configuration of the electrical circuitry is provided, which is advantageous for being forgiving for LED failures. That is, failures arising from an open circuit or short circuit in the electrical circuitry of the LED matrix will only affect one row in the array, and a lighting application in which the LED matrix is integrated will still be functional. The connection tracks are here based on leads with a cross section of 0.2*0.2 mm and the length of the connection tracks are selected such that the finished LED matrix has a LED pitch of 75 mm in each dimension. The LED pitch for the LED matrix layout is preferably selected within a range of 50 to 100 mm, and the cross section of the connection tracks are selected depending on the material used in the conductor sheet.

As illustrated in FIGS. 1a) and 1b), the first predetermined pattern 115 is selected such that integrity of the conductor sheet 150 is governed by bridging portions 117. The first predetermined pattern 115 is here further selected for providing alignment holes 118 arranged in edge portions 125 of the conductor sheet 150 for alignment of the conductor sheet 150 in the mounting and trimming facilities during the mounting of LEDs, and stretch alignment holes 119 for applying a stretching tool, which will be described with reference to steps [1102] and [1104] respectively, herein under.

Figure 1B:
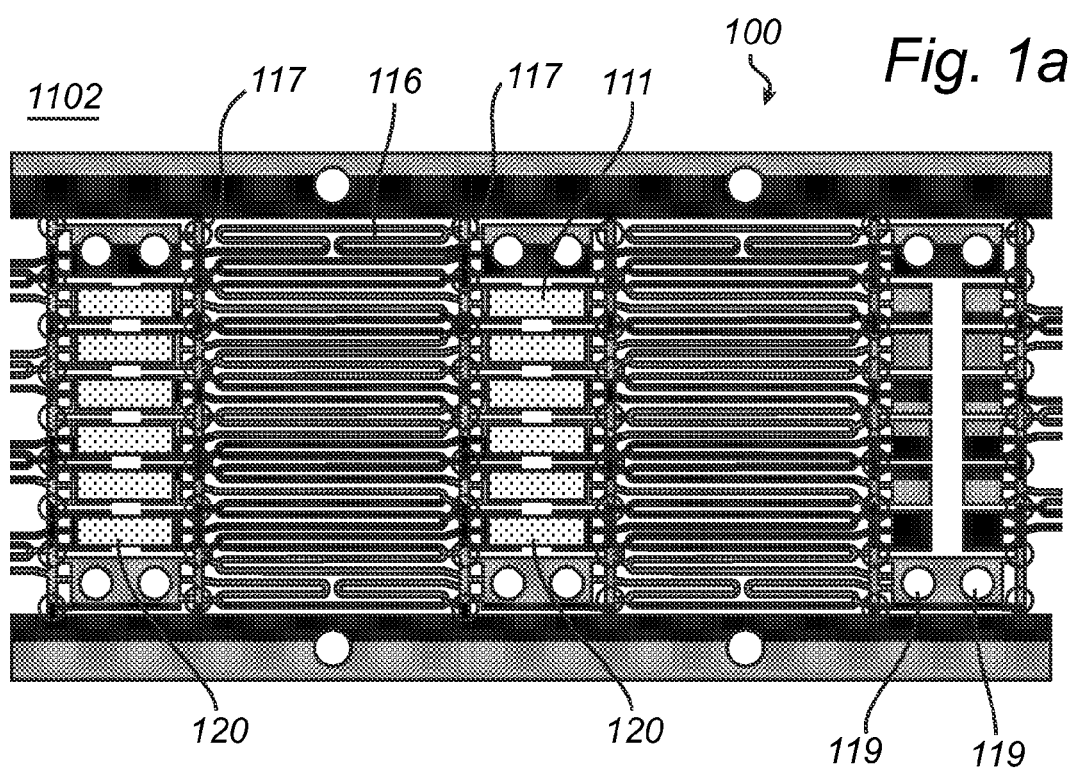

With reference now to FIG. 1b), in step [1102], the LEDs are mounted to the first conductor structure 100 forming a subassembly. The mounting may be done by means of a standard LED assembly process, i.e. solder is screen printed onto component areas connection pads 111a, 111b, and LEDs 120 are placed onto the component areas 111 followed by soldering of the LEDs 120, which soldering may be performed in a reflow soldering process.

Figure 1C:
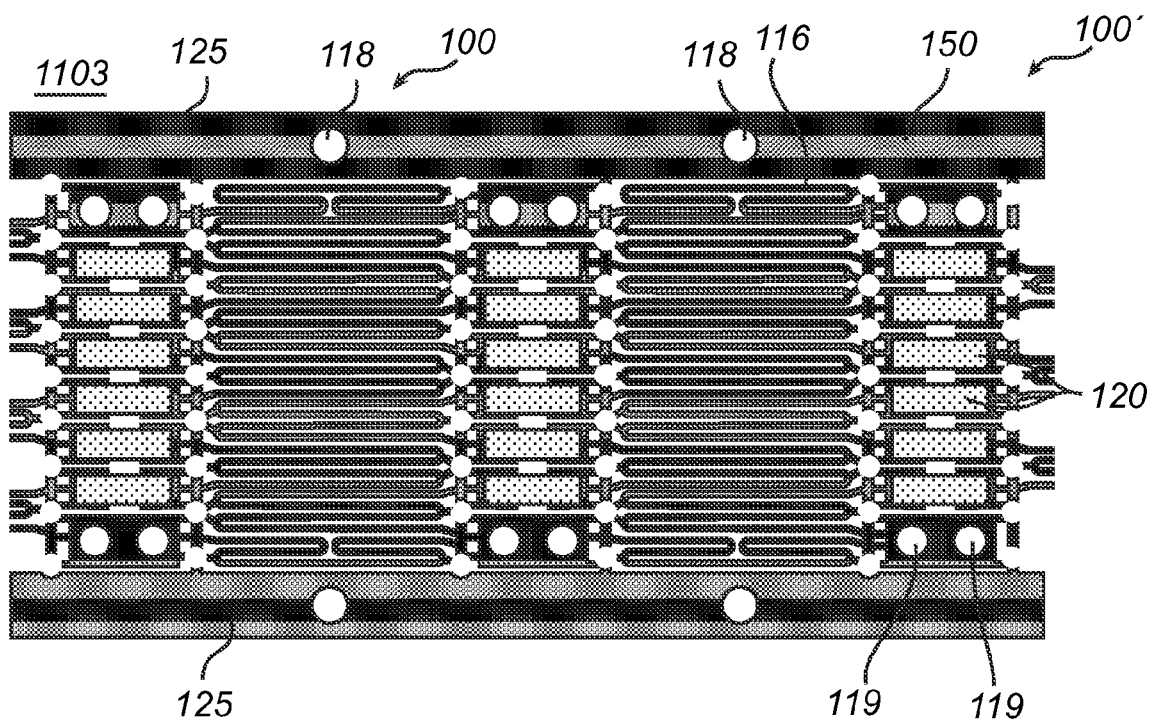

In a step [1103] a final predetermined pattern corresponding to a second conductor structure 100', i.e. the electronic circuitry of the LEDs 120, is provided to the subassembly by trimming of the bridging portions 117. The second conductor structure 100' with the bridging portions 117 removed is illustrated in FIG. 1c). Further, the edge portions 125 of the conductor sheet 150 are trimmed off from the conductor circuitry. Trimming of the conductor sheet may be performed by e.g. laser cutting or punching. In a process of providing a number of subassemblies on a continuous conductor sheet, e.g. when the method is implemented in a reel-to-reel process, the processed conductor sheet is divided into a number of individual subassemblies (conductor structure with mounted LEDs).

Figure 1D:
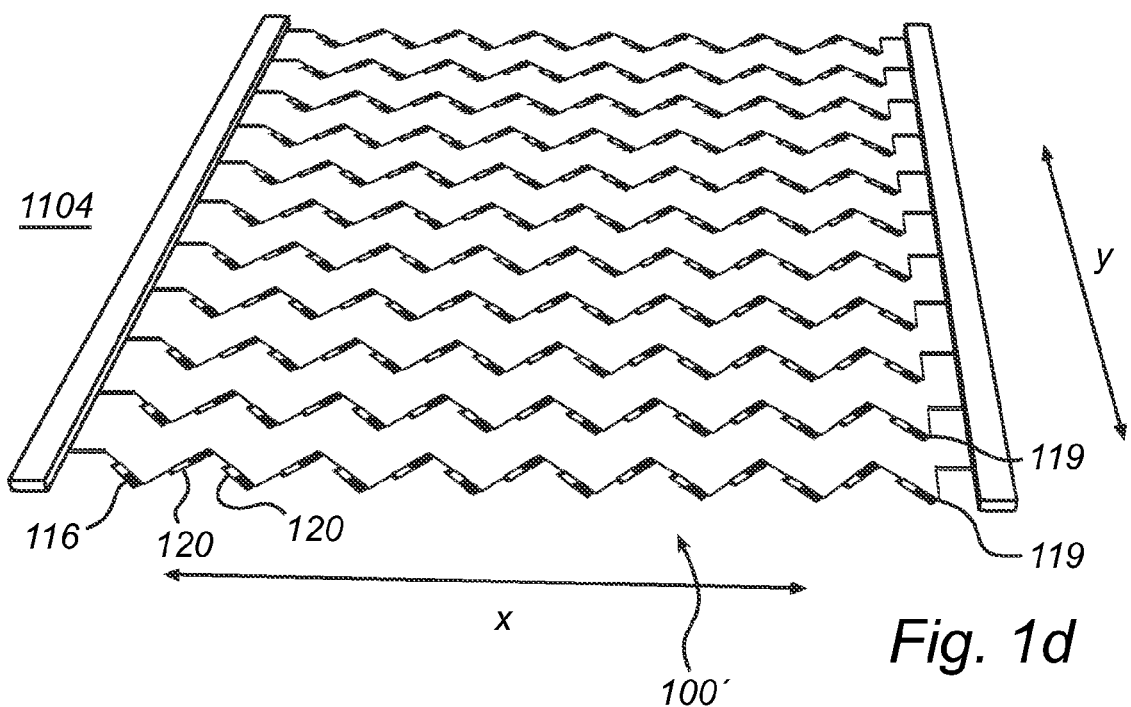

Referring now to FIG. 1d), in step [1104] the subassembly, i.e. the conductor structure 100' containing the trimmed meandering connection tracks 116 which electrically connects the LEDs 120, is stretched, thereby straightening the connection tracks 116. The stretching is performed in two dimensions such that the lead frame is expanded in two dimensions (x, y) to a final LED matrix. The maximum stretching force is preferably selected to be a factor 10 lower than the break force of the connection tracks, which depends on the selected conductor sheet material and the selected cross section of the connection tracks.

In the exemplifying embodiment, a 200 μm thick etched copper sheet provided with 13×13 LEDs interconnected with meandering (or folded) conductor portions is stretched and thereby expanded from an initial lead frame size of 30*200 mm to 600*600 mm. The area of the final LED matrix is thereby 60 times larger than the working size during manufacturing of the lead frame. Thus, the application of solder by screen printing, and mounting of components on the lead frame with meandering conductor portions, before stretching offers a very efficient, highly advantageous manufacturing method for large area LED matrices.

Figure 1E:
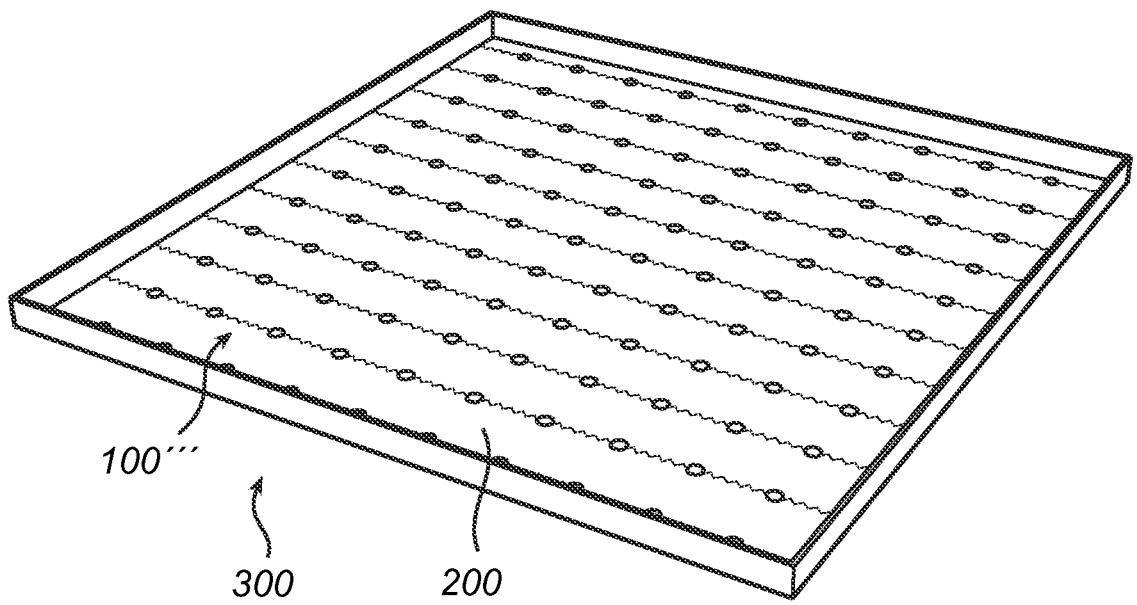

In FIG. 1e) the final LED array, i.e. the stretched subassembly 100" is mounted on a substrate 200, which here is a tile, thereby forming a light tile 300. The final LED array may be arranged on any suitable substrate, for instance a reflector or an insulated heat sink. Light tiles according to the present inventions, as illustrated in FIG. 1e), are preferably manufactured with dimensions ranging from 600*600 to 600*1200 mm. Further, other applications like for instance head light applications are applicable for the present inventive concept, e.g. for TL retrofit in which dimensions of 150*150 mm are preferred.

Figure 2A:
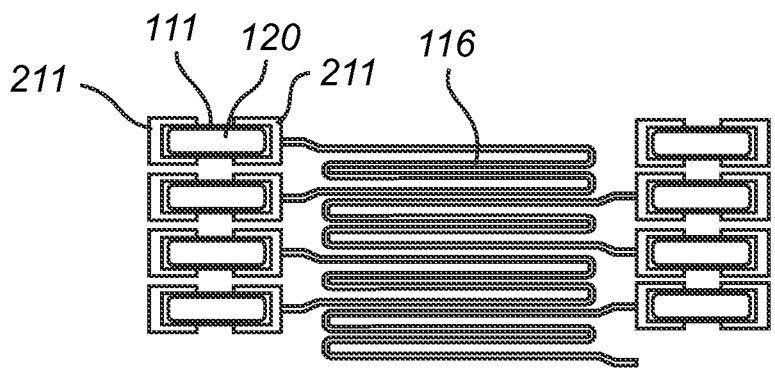
FIGS. 2a) to b) are schematic illustrations of details of embodiments of a LED matrix according to the present invention.
Figure 2B:
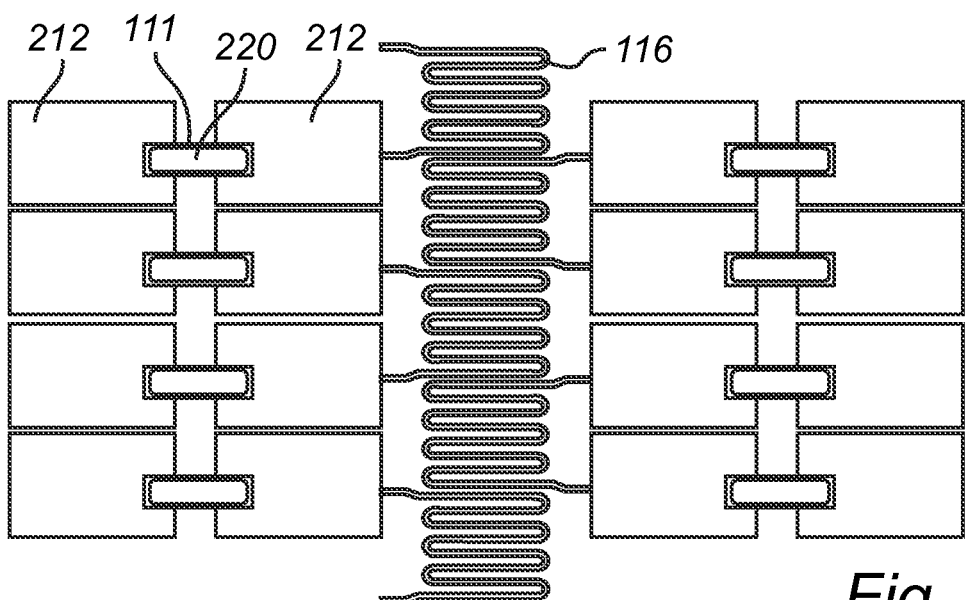

According to an embodiment of the invention, the first predetermined pattern is selected such that thermal pads are integrated in the conductor structure. The thermal pads may be arranged at a component area, as illustrated in FIGS. 2a) and 2b). In FIG. 2a) a design for extra thermal pads 211 arranged at the component area 111 is shown, in which the thermal pad design is adapted for low power LEDs 120. For high power LEDs 220, larger thermal pads 212 are arranged at the component area 111 for facilitating thermal dissipation from the LEDs 220, as visualized in FIG. 2b).

According to an embodiment of the invention, referring now to FIG. 3, for mounting of small package LEDs 320, the component area 111 of the conductor structure is provided with a recess 311. As illustrated in the sequence performed in FIGS. 3a)-3d), here thermal pads 212 of the conductor structure (only a detail of the conductor structure is shown) are arranged at the component area 111, which comprises two dedicated connection pads 111a, 111b arranged having an initial gap Δ. The gap Δ is then reduced by means of forging tool 400, as illustrated in FIG. 3b). At the same time as the gap Δ is reduced, the forging tool 400 forms a recess 311 in the component area 111. The size of the recess 311 is selected to fit a small package component 320, and is here selected to fit a 0.5*0.5*0.3 mm Wafer Level Chip Scale Package, WLCSP. This step is advantageously integrated in a reel-to-reel process as described above.

The invention has mainly been described above with reference to a few embodiments. However, as is readily appreciated by a person skilled in the art, other embodiments than the ones disclosed above are equally possible within the scope of the invention, as defined by the appended claims.

The invention claimed is:

1. A method for manufacturing an LED matrix comprising:
providing a first conductor structure comprising a plurality of component areas interconnected with meandering connection tracks by providing a conductor sheet with a first predetermined pattern,
wherein the first predetermined pattern includes at least one integrity governing bridge that inhibits straightening of at least one connection track among the meandering connection tracks;
mounting a plurality of LEDs, each to a respective component area of said first conductor structure thereby forming a subassembly;
trimming said subassembly to provide a second conductor structure,
wherein trimming said subassembly releases the at least one integrity governing bridge to permit straightening of the at least one connection track; and
stretching said subassembly thereby straightening said connection tracks;
wherein said second conductor structure is arranged such that an m×n LED conductor matrix is formed during said step of stretching.

2. A method according to claim 1, further comprising: arranging said stretched subassembly onto a substrate.

3. A method according to claim 1, wherein said first predetermined pattern is selected for providing at least one thermal pad area in said first or second conductor structure.

4. A method according to claim 3, wherein said at least one thermal pad area is arranged at a component area, or at a connection track.

5. A method according to claim 4, further comprising providing at least one recess in said component area for receiving LEDs or LED packages of a size less than 1×1×1 mm.

6. A method according to claim 5, wherein said step of mounting comprises:
defining solder areas on said first conductor structure;
applying solder onto said solder areas;
placing said LEDs on a respective component area, and performing soldering.

7. A method according to claim 6, wherein said first or second conductor structure is arranged with alignment features and/or stretch alignment features.

8. A method according to claim 7, further comprising providing mechanical deformation of said subassembly by means of one of splitting, trimming of the subassembly to a predetermined contour.

9. A method according to claim 8, further comprising deforming at least one portion of said subassembly to provide a predetermined lighting direction of at least one LED.

10. A method according to claim 9, further comprising providing deformation of said subassembly for providing one of: optical properties, mechanical fixation of a component interconnect board, mechanical fixation of additional components, thermal properties, and connector functionality.

11. A method according to claim 10, wherein at least one of providing said first predetermined pattern and said second conductor structure is done by means of etching, cutting, punching, slitting or laser cutting.

* * * * *